United States Patent [19]

Jensen et al.

[11] Patent Number: 5,751,559
[45] Date of Patent: May 12, 1998

[54] APPARATUS FOR INSERTING PC CARDS HAVING RECESSED GUIDE PATHS WITH MULTIPLE LEVELS IN THE GUIDE PATHS

[75] Inventors: David John Jensen, Raleigh; Charles Steven Lingafelt, Durham, both of N.C.

[73] Assignee: International Business Machines Corporation, Armonk, N.Y.

[21] Appl. No.: 728,295

[22] Filed: Oct. 8, 1996

[51] Int. Cl.[6] .................................................. H05K 1/11
[52] U.S. Cl. ........................... 361/802; 361/741; 361/742; 361/803; 361/758; 361/755; 439/259; 439/376
[58] Field of Search ............................ 361/727–730, 361/736, 737, 741, 742, 752, 756, 758, 796, 801–804, 816, 818, 755; 439/376, 377, 259, 630, 631, 629, 632

[56] References Cited

U.S. PATENT DOCUMENTS

| | | | |
|---|---|---|---|
| 3,017,232 | 1/1962 | Schwab et al. | 312/223 |
| 3,711,814 | 1/1973 | Pomella et al. | 339/65 |
| 4,445,740 | 5/1984 | Wallace | 339/45 |
| 4,789,352 | 12/1988 | Kreinberg et al. | 439/260 |
| 4,846,699 | 7/1989 | Glover et al. | 439/64 |
| 4,941,840 | 7/1990 | Okada | 439/376 |
| 5,238,423 | 8/1993 | Hillis et al. | 439/259 |
| 5,302,136 | 4/1994 | St. Germain et al. | 439/376 |
| 5,317,481 | 5/1994 | Hillis et al. | 439/259 |
| 5,325,269 | 6/1994 | Someno | 361/796 |
| 5,363,281 | 11/1994 | Baitz et al. | 361/801 |
| 5,366,385 | 11/1994 | Treleaven | 439/377 |

*Primary Examiner*—Leo P. Picard
*Assistant Examiner*—Anthony Dinkins
*Attorney, Agent, or Firm*—Joscelyn G. Cockburn

[57] ABSTRACT

An apparatus capable of housing PC cards including a PC card with a connector and PC card guide, a housing having an insertion opening for inserting the PC card and a circuit board mounted in the housing. The connecting direction between the PC card and the circuit board is perpendicular to the insertion direction of the PC card. The apparatus further includes guides arranged on the housing having two cam plates which are separated by spacers and supported by a shaft. Each cam plate has a continuously recessed guide path for guiding the PC card. The guide path has a guiding portion and a stop portion wherein the transition of the pivot pin from the guiding portion to the stop portion causes a defined rotation of the plug-in package about the pivot point wherein the plug-in package is rotatably arranged at the pivot point. This allows the PC card to make a pivot motion in order to accomplish the connection between the plug-in package and the circuit board.

22 Claims, 5 Drawing Sheets

5,751,559

APPARATUS FOR INSERTING PC CARDS HAVING RECESSED GUIDE PATHS WITH MULTIPLE LEVELS IN THE GUIDE PATHS

FIELD OF THE INVENTION

The invention relates to an apparatus for inserting PC cards into computer casings, especially an apparatus for inserting PC form factor cards.

BACKGROUND OF THE INVENTION

There are many useful standard PC cards available on the market whose connector is arranged at a right angle to the front of the card. Up to now, all these cards have the attribute that insertion and removal requires right angle access (with respect to the front of the card) to the connector to which the card is plugged into, i.e. the "top" and/or "side" of the casing have to be removed to allow access to the connectors. For safety reasons, this requires the machine to be powered down, and if rack mounted, removed from the rack, or if the environment that the machine is in is physically restrictive, the removal of the machine from that environment. This takes significant time and in some cases more than one person is required to physically move the machine. Additionally, all cables to the casing must be disconnected and properly labelled to allow correct reconnection when the casing is returned to service. This type of service is very costly and disruptive for the customer. An alternative solution to the card insertion/removal problem via "top" or/and "side" is front access. This means that the casing is not removed from its environment, the top/side is not removed, but rather the card is inserted/removed entirely from the front of the box. This "front access" type of service is much less costly and disruptive to the customer and therefore highly desirable. Thus, there is a large market demand for "front access" cards.

The number of useful standard PC form factor cards available today is large. The production cost of these cards is minimized due to the large number of competing suppliers of these cards. In view of this situation, it would be a very significant cost and development expense advantage for a company to be able to insert/remove unaltered standard PC form factor cards from a product. This would allow the industry to make immediate use of solutions that enable unaltered standard PC form factor cards whose connector is arranged at the right angle to the front of the card to be "front access" plugged into a machine.

DESCRIPTION OF THE RELATED PRIOR ART

U.S. Pat. No. 3,017,232 discloses an assembly for inserting a circuit card along card guides and the retention of the card. The assembly makes use of shafts which accept card guides, required, for which a circuit card slides into. The direction of the card insertion motion is in the same direction as the mating motion which only addresses the insertion of a PC card in a casing by a top to bottom motion and gives no hint to the problem how to use a standard PC card whose connector is arranged at the right angle to the front in a front access machine.

U.S. Pat. No. 3,711,814 discloses an assembly for inserting a circuit card along card guides and the retention of the card. This patent does not address the insertion of PC cards through the front of the machine.

U.S. Pat. No. 5,302,136 discloses an apparatus for preventing misengagement of multipoint connector elements including a mounting rack having a pivot slot and a stepped guide surface, along with an associated receptacle element of a connector. Only when the pivot pin is fully seated in the pivot slot will the plug elements be able to engage. This patent does not address the problem how to use a standard PC card in a front access machine. It mainly pertains to the prevention of misengagement of electrical connectors.

U.S. Pat. No. 5,317,481 discloses a system for installing a circuit board edge connector into a motherboard connector from the side. The system has an insertion tool which conveys the circuit board across the motherboard and positions it with the pins of both boards aligned. This patent teaches a very complicated installation system which is not user-friendly.

None of the prior art patents are teaching an assembly allowing the use of standard PC cards, whose connector is arranged at a right angle to the front of the card, in a front access machine.

SUMMARY OF THE INVENTION

It is therefore an object of the present invention to provide a simple, low cost, easy to manufacture, easy to use, reliable apparatus for front card insertion.

It is yet another object of the present invention to provide an apparatus for front card insertion for standard PC form factor card.

According to the present invention, an apparatus, capable of housing PC cards, is provided. Each PC card has at least a connector and means for mounting the PC card to a first guide means. The first guide means includes a pivot guide pin and first and second guide pins. The apparatus further comprises a housing having an insertion opening for inserting the PC card into said housing and a circuit board mounted in the housing. The circuit board has a socket for connecting the connector of the PC card with the circuit board, wherein the connecting direction between the circuit board and the PC card is perpendicular to the insertion direction of the PC card. A second guide means is arranged along the opening of the housing for guiding the PC card and first guide means into the housing. The second guide means has two cam plates which are separated by spacer means and supported by shaft means. Each of the cam plates has a continuously recessed guide path for guiding the pins. The guide path has, with respect to the connecting direction, a guiding portion located at a first level and a pivot stop portion defining a moving pivot point located at a second level. The transition of the pivot pin from the first to the second level and within the stop portion causes a defined rotation of the first guide means and connected PC card (plug-in package) about the pivot point and the plug-in package is rotatably arranged relative to the pivot point.

Furthermore, other guide slots are arranged in the guide path on the guiding portion, and the stop portions, one of each associated with one of the other guide slots, are located in the second location, displaced from the pivot stop portion. The first and second guide pins follow respective ones of the other guide slots and lodge in respective ones of the other stop portions when a connection between said connector and said socket is accomplished.

The present invention has the important advantage that the pivot point is not fixed, but moves horizontally as the card is inserted into the socket. This allow the card's edge connector to enter the socket without mechanical interference. Without the horizontal motion, the mechanical insertion mechanism would be much more complicated.

A further important aspect of the present invention is that the spacing between the cards is variable because of the method of supporting the mechanical card insertion guides. Different sizes of PC cards may be used without changing the assembly of the present invention.

DETAILED DESCRIPTION OF THE PREFERRED EMBODIMENT

Figure 1:
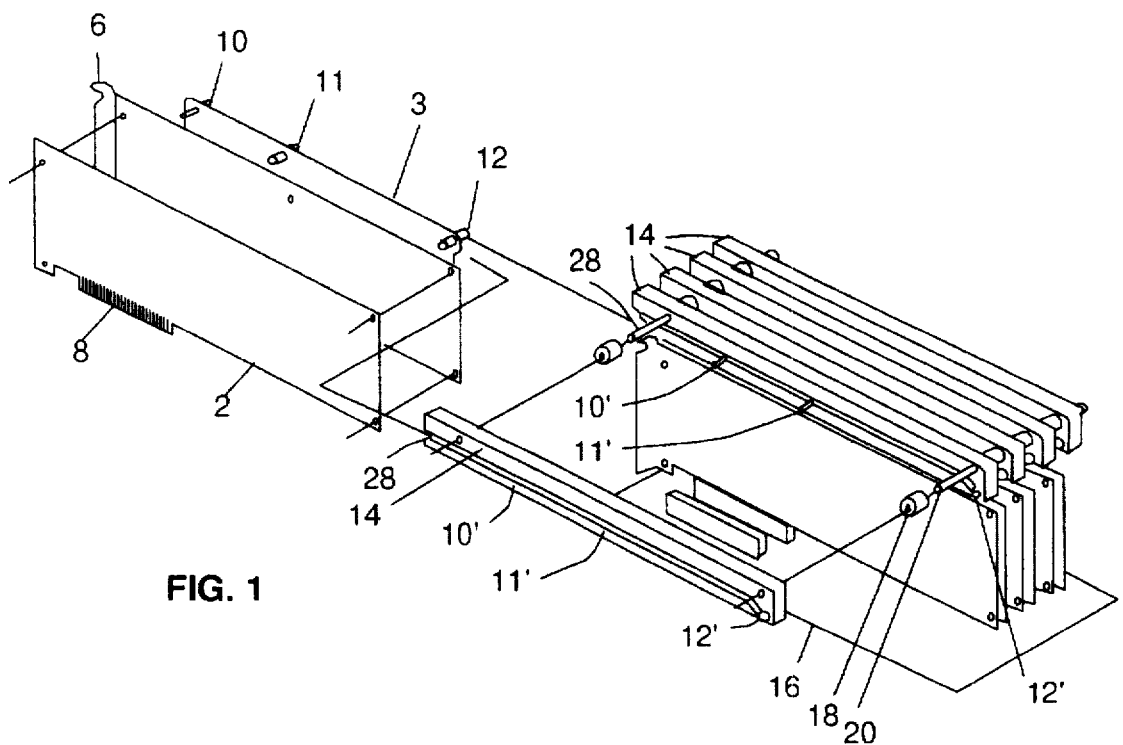
FIG. 1 is an exploded view of a preferred embodiment of the present invention.

FIG. 1 shows an exploded view of the inventive mechanism assembly which allows the front insertion of plug-in packages. The plug-in package normally comprises a standard PC adapter card 2, a carrier 3 and a lever 6. The PC card 2 and the lever 6 are arranged on the carrier 3. Furthermore, the carrier 3 has guide pins 10, 11, 12 for inserting the plug-in package into the housing. However, the plug-in package may also consist of a single PC card 2 on which the lever 6 and the guide pins 10, 11, 12 are arranged. The housing comprises guide means preferably cam plates 14 for guiding the PC card 2 by the guide pins 10, 11, 12 into the housing. The PC card 2 includes a substrate, a plurality of electronic components mounted on the substrate and fasteners or the like for attaching the substrate to the carrier 3. It should be noted that fewer than three pins can be used to position the card.

The carrier 3 may be fabricated, inexpensively, out of sheet metal. Sheet metal is used to allow for easy and low cost customization of the front of the carrier 3 to any I/O coming off the PC adapter card. Of course, other material could be used to fabricate the carrier. Only the front bracket portion of the carrier 3 would need to be customized for a specific PC card. The remainder of the carrier would be the same for all cards.

On the carrier 3 are arranged three pins 10, 11, 12 of different diameter and lengths, press fitted perpendicular to the carrier 3. Each of these pins follow a particular path on the cam plate 14 when the carrier 3 is inserted.

In one embodiment of the present invention, a guide mechanism 32 formed by two cam plates 14 are required for each adapter card 2. These cam plates 14 are attached to the stationary shafts 20 in the apparatus and do not move. Each of the single cam plates 14 has a recessed guide path 28 for guiding the pins 10, 11, 12 which have different diameters and lengths. The guide path has slots 10', 11', 12' which are arranged with different sizes and depths. The guide path has a guiding portion and a stop portion wherein the stop portion is vertically displaced from the guiding portion. The slots 10', 11', 12' correspond to the diameters and lengths of the three pins 10, 11, 12 on the carrier 3. Preferably the slots 10', 11', 12' are symmetrically arranged about a vertical midplane of the part which means the slots on the right side of the part are identical to those on the left side of the part.

This allow the carrier 3 and its pins 10, 11, 12 to be centered between the two cam plates 14 and the left half on the pins 10, 11, 12 to track in the cam plate 14 on the left and the right half on the pins 10, 11, 12 to track in identical slots 10', 11', 12' in the cam plate 14 on the right. Because the carrier 3 is centered between the cam plates 14, the force applied by the user to insert and plug the PC card 2 is equally distributed above the planar connector, eliminating any eccentric loads. Preferably, the cam plate 14 can be an injection molded part and therefore can be low cost and lightweight while still dimensionally stable.

In a further embodiment of the present invention, only one dedicated cam plate 14 is required for each adapter card. In that case each single cam plate 14 has a recessed guide path 28 on both sides in which the slots 10', 11', 12' are arranged accordingly. In this embodiment, each cam plate 14 is shared by two adapter cards.

Figure 3:
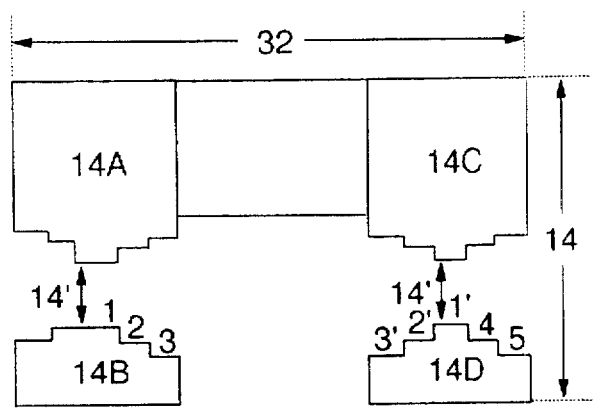
FIG. 3 shows an end view of the guide mechanism.

FIG. 3 shows an end view of the guide mechanism 32. As discussed above, the guide mechanism 32 includes two cam plates 14 connected, in spaced relation, on shaft 20. Even though the figure shows each cam plate as separate members (such as 14a, 14b and 14C, 14d), it should be noted that each cam plate (i.e., 14a and 14B, 14C and 14d) is a unified piece with openings 14' at one end of each cam plate. Still referring to FIG. 3 and for purposes of description, the left hand side cam plate 14a and 14B has separate cam surfaces 1, 2 and 3. Likewise, the right hand side cam plate 14c and 14d has matching cam surfaces 1', 2' and 3'. Cam surfaces 1 and 1' provide the surfaces on which one of the pins in carrier 3 traverses as the carrier is transported horizontally along its path so that a PC card can be inserted in a connector 34 (described below) mounted on the circuit card 36 (described below). Similarly, cam surfaces 2 and 2' provide another pair of surfaces over which another pin in the carrier 3 travels. Finally, the third pin in the carrier 3 travels along surfaces 3 and 3'. It should be noted that surfaces 1', 4, and 5 provide one half of a set of guiding surfaces which would match similar surfaces in another guide plate (not shown) to provide the cam surfaces over which another carrier supporting another PC card would travel. It is obvious from the above description that a plurality of the plug-in packages (including guide mechanism 32, carrier 3 and PC card) would be mounted in a housing to form the apparatus such as a PC or similar device.

Figure 2:
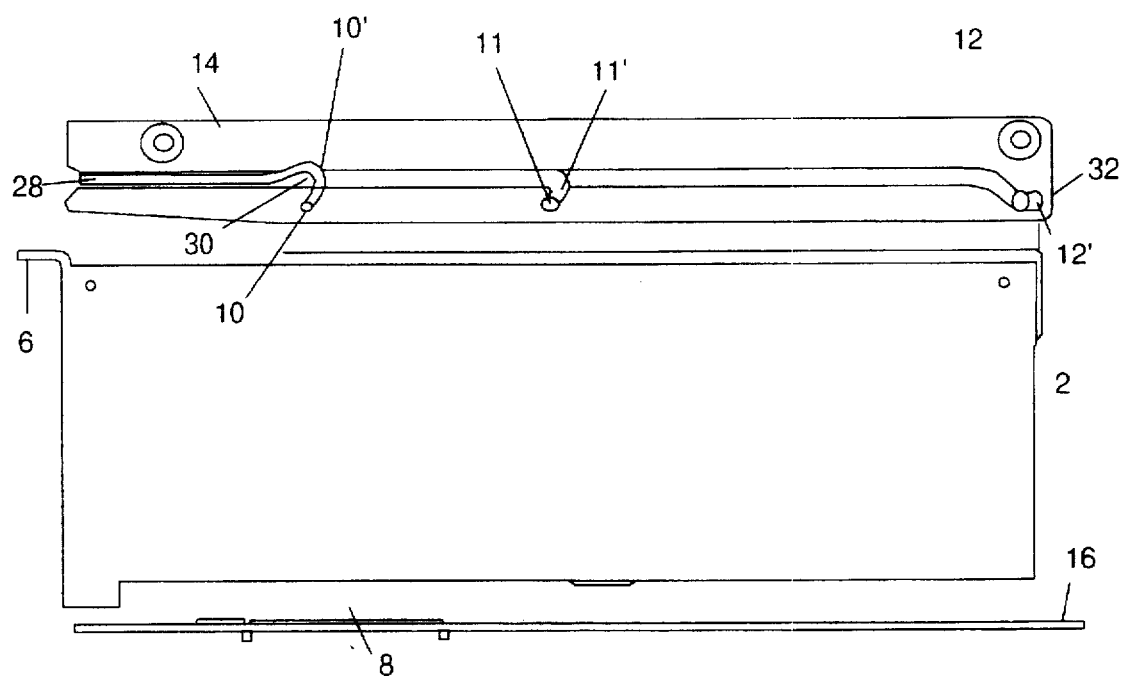
FIG. 2 is a side view of the embodiment of FIG. 1.
Figure 4:
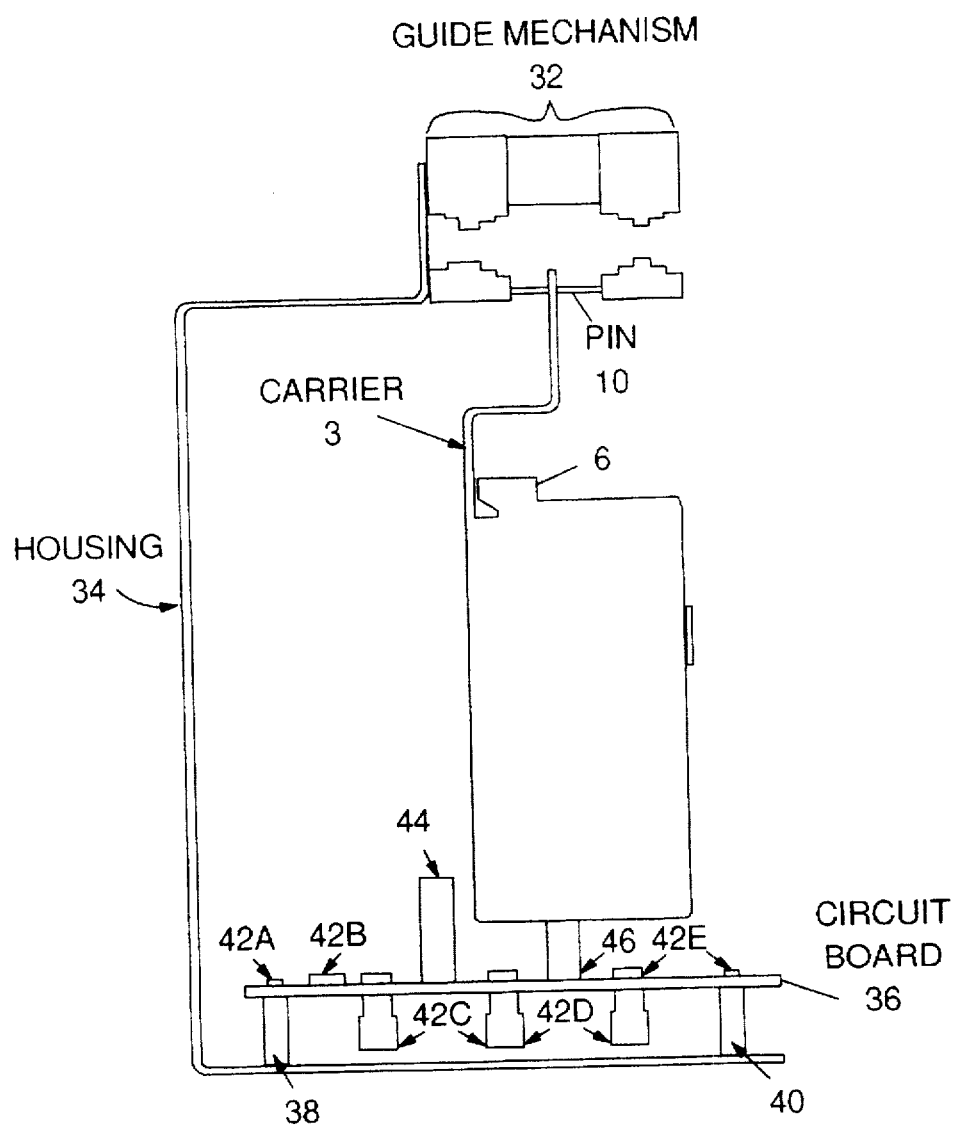
FIG. 4 shows an end view of a system or machine according to the teachings of the present invention.

FIG. 4 shows an end view of the system or machine according to the teachings of the present invention. The machine includes housing 34 to which guide mechanism 32 is connected. Details of the guide mechanism 32 has already been described above and will not be repeated here. The carrier 3 with lever 6 supports the circuit card (not shown) which is inserted in socket 46. Another socket 44 is mounted on circuit board 36 which is connected by connectors 38 and 40 to housing 34. A plurality of electrical components 42a, 42b, 42c, 42d and 42e are mounted on circuit board 36. The end view also shows one of the pins (10) in its home position in slots on cam plate 14. FIG. 2 also shows the pin in its home position.

When inserting and plugging a PC adapter card 2 (FIG. 1) through the front of a machine, in all situations the user is constrained to use a horizontal insertion motion parallel to the planar circuit board 3b (FIG. 4) which the PC card would plug. However, a vertical insertion motion is required to actually plug the PC card 2 into the planar circuit board. Currently, the user would have to remove the covers in order to obtain the vertical motion. The solution to this problem is to approximate the vertical motion required by allowing the user plugging the PC card 2 to make use of a horizontal insertion motion and a defined rotation about a pivot point. The three pins 10, 11, 12 are arranged on the carrier 3 and are sliding into the slots 10', 11', 12' which are arranged in the guide path 28 of the cam plates 14 and provide the required motion to approximate the vertical insertion motion necessary. The approximated vertical motion is achieved by alternating an incremental horizontal displacement with a incremental angular displacement. If the pivot pin 12 is located on a significant distance from the mating connectors 8, then the arc which the connector 8 on the PC card would follow will be mostly a vertical displacement if the angle of the rotation is small. By alternating this small angular displacement with a small horizontal displacement of the pivot point, mostly vertical motion can be accomplished. When the user inserts the PC card 2 into the cam plate 14, the slots 10', 11', 12' in the cam plate 14 permit the user to insert the PC card 2 with only the required combination of horizontal and rotational displacement necessary to properly plug the PC card 2.

Figure 5A:
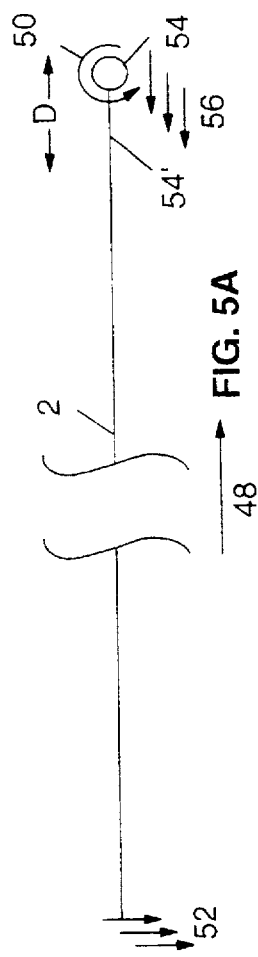
FIGS. 5A and 5B show views illustrating the moving pivot point.
Figure 5B:
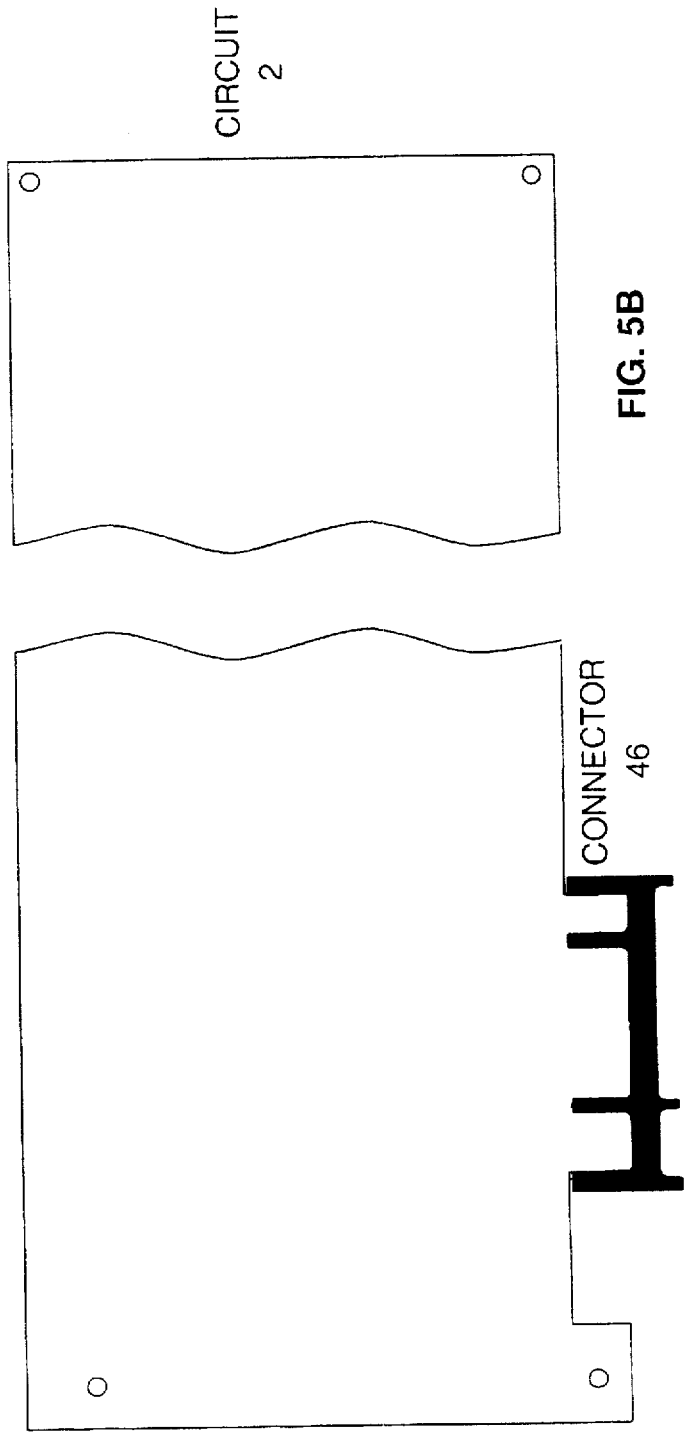

FIGS. 5A and 5B demonstrate the motion of circuit card 2 from the time it is inserted into the front end of the housing until it is properly seated in connector 46. With reference to FIG. 5A, circuit card 2 is first inserted in the opening of the housing and is transported horizontally in the direction shown by arrow 48 until pin 54 reaches the home position slot whereby the card is moved in the direction shown by arrow 52 and pivots in the direction shown by arrow 50. As the card is moved in the downward motion perpendicular to the horizontal direction 48, that pivot point 54 moves horizontally in the direction shown by arrow 56, a distant D to point 54. At this point, the circuit card 2 (FIG. 5B) is fitted snugly in connector 46.

FIG. 2 shows a side view of the PC card completely inserted into the machine and mated with connector 8, mounted on the planar card 16. The pins 10, 11, 12 serve dual purposes of ensuring the carrier 3 will track properly in the cam plates 14 and the user will insert the carrier through the correct motion.

A unique feature of the cam plate 14 and the carrier 3 is the integration of the three cam slots 10', 11', 12' per side of the cam plate 14 without losing the ability to have each of the three pins 10, 11, 12 on the carrier 3 follow the correct recessed guide paths to the correct slots 10', 11', 12'. This is achieved by having the diameters and lengths of the pins 10, 11, 12 on the carrier 3 different dimensions and the depths and widths of the slots 10', 11', 12' on the cam plates 14 different dimensions. Pin 12 has the largest diameter, it cannot fall into the opening for the slots 10', 11' designed for pin 10 or pin 11. Conversely, pin 10 is the longest pin and although with the smallest diameter it will fit in the width of any slot 10', 11', 12' it can only travel in the first and deepest recessed guide path. Pin 11, which has the intermediate diameter and length, is not able to follow the recessed guide path for pin 10 because the diameter of pin 11 is too large; and it cannot follow the recessed guide path for pin 12 because the length of pin 11 is too long to fit in the depth of the recessed guide path for pin 12.

A further important feature of the present invention is the mechanical advantage obtained for plugging and unplugging the connectors 8. Because the user inserting the PC card 2 is actually doing so with a motion based about a pivot point, the user realizes a lower insertion force of the connector 8 since there is a moment arm equal to the distance from the connector to the user's hand.

Another important aspect of the present invention is the modularity of the design. In FIG. 1 four card slots are shown. However, any number of card slots with any desired spacing can be configured. This is done by means of the spacer 18 and the shaft 20, mounting the cam plates 14. The assembly of the mechanism consists of sliding a cam plate 14 onto the two supporting shafts 20. Spacers 18 of the proper length to give the required card pitch are then slid onto the shafts 20.

The spacers 18 are then followed with another cam plate 14. This assembly process is repeated as many times as there are slots required. The card pitch can be changed simply by using longer or shorter spacers 18. By having identical slots in both sides of the cam plate 14, this modularity is possible. Also, the cam plates 14 are always properly aligned to one another since they all mount on the same shafts 20. All parts, the carrier 3, cam plates 14, spacers 18 and shafts 20 are inexpensive.

This invention employs a unique method of shafts and spacers which allow the slot width to be determined by industrial standard, off-the-shelf, low cost parts. This allows the invention to be used unaltered in other products with card pitch different than the current embodiment.

Furthermore, this invention uses un-altered PC cards, enabling the mechanical front insertion of the un-altered cards. This enables the use of existing standard PC form factor cards and future standard PC form factor cards that will be developed. Besides, the invention insures a mostly vertical insertion of the card edge connector into the planar connector, no mating pins of the two connectors swipe over other pins. This has significant electrical characteristic value.

Summarizing, the operation of the present invention is briefly described by the following steps:

1. The PC adapter card is attached to the carrier 3 with either the card's standard mounting holes or an invention bracket.

2. The card and carrier assembly (called plug-in package) are then inserted into the machine with the three pins 10, 11, 12 in the carrier guide on different cam surfaces in recessed guide path 28 into the slots 10', 11', 12' molded into the cam plates 14.

3. The motion which is defined by the cam plate 14 will only allow the user inserting the carrier 3 to properly insert the card edge connector 8 on the PC card into the connector on the planar 16.

4. The incremental vertical and angular displacements made possible by moving pivot pin 12 then seat the connector 8 when the user applies the required force. The required force is reduced from the force required to plug the connector 8 normally, since a lever arm about moving pivot is used in the present invention.

What is claimed is:

1. An apparatus capable of housing plug-in packages, each plug-in package having at least a connector and plug-in package guide means, said apparatus comprising:

a housing having an insertion opening for inserting said plug-in package into said housing and housing guide means arranged on said housing for guiding said plug-in package by said plug-in package guide means into said housing;

a circuit board mounted in said housing, said circuit board having a socket for connecting said connector of said plug-in package with said circuit board, wherein said connecting direction between said circuit board and said plug-in package is perpendicular to the inserting direction of said plug-in package wherein;

said plug-in package guide means has at least a pivot guiding pin which is arranged at a significant distance from said connector;

said housing guide means has a continuously recessed guide path for guiding said pivot guiding pin, said guide path has a guiding portion located at a first level and a stop portion defining a moving pivot point located at a second level and the transition of said pivot pin from said guiding portion to said stop portion causes a defined rotation of said plug-in package about said pivot point in the plane defined by said socket and said connector wherein said plug-in package is rotatably arranged at said pivot point.

2. Apparatus as claimed in claim 1, wherein the transition from said first and said second level of said guide path is achieved by alternating an incremental horizontal displacement with an incremental angular displacement.

3. Apparatus as claimed in claim 1, wherein said plug-in package guide means further has a first guide pin arranged on said plug-in package and wherein said housing guide means further has a first guide slot arranged into said guiding portion of said guide path wherein said first guide pin is located within said first guide slot when a connection between said socket and said connector is accomplished.

4. Apparatus as claimed in claim 3, wherein said plug-in package guide means further has a second guide pin arranged between said first guide pin and said pivoting pin on said plug-in package and said housing guide means further has a second guide slot arranged into said guiding portion of said guide path wherein said first and second guide pins are located within said first and second guide slot when a connection between said socket and said connector is accomplished.

5. Apparatus as claimed in claim 4, wherein said guide slots are transversely arranged in said guiding portion.

6. Apparatus as claimed in claim 4, wherein the width of said pivot guiding pin is greater than the width of said guide slots and the width of said second guide pin is greater than the width of said first guide slot.

7. Apparatus as claimed in claim 3, wherein the transition of said guide path into said first guide slot is raised and curved wherein said raised portion is partly extended within said path.

8. Apparatus as claimed in claim 4, wherein the length of said first guide pin is greater than the length of said pivot and said second guide pin so that only said first guide pin can follow said raised portion into said first guide slot.

9. Apparatus as claimed in claim 1, wherein said housing guide means comprises for each plug-in package two separate cam plates which are separated by spacer means and supported by shaft means wherein each cam plate has its own recessed guide path and guide slots.

10. Apparatus as claimed in claim 1, wherein said plug-in package contains a printed circuit, a carrier and a lever, wherein said printed circuit, said plug-in package guide means and said lever are attached on said carrier.

11. Apparatus capable of housing plug-in packages, each plug-in package having at least a connector and plug-in guide means, said plug-in guide means having a pivot guide pin which is arranged on a significant distance from said connector and first and second guide pins, said apparatus comprising:

a housing having a insertion opening for inserting said plug-in package into said housing;

a circuit board mounted in said housing, said circuit board having a socket for connecting said connector of said plug-in package with said circuit board, wherein said connecting direction between said circuit board and said plug-in package is perpendicular to the insertion direction of said plug-in package;

a second guide means arranged on said housing for guiding said plug-in package by said plug-in package guide means into said housing, said second guide means comprises two cam plates which are separated by spacer means and supported by shaft means, each of said cam plates has a continuously recessed guide path for guiding said pins, said guide path has a guiding portion at a first level and a stop portion defining a moving pivot point for said plug-in package at a second level wherein the transition of said pivot pin from said guiding portion to said stop portion causes a defined rotation of said plug-in package about said pivot point in the plane defined by said socket and said connector wherein said plug-in package is rotatably arranged at said pivot point; and guide slots are arranged in said guide path on said guiding portion, wherein said pivot guide pin is located in said stop portion and said guide pins are located within said guide slots in said guiding path when a connection between said connector and said socket is accomplished.

12. Apparatus as claimed in claim 11, wherein the transition from said first to said second level of said guide path is achieved by alternating an incremental horizontal displacement with an incremental angular displacement.

13. Apparatus as claimed in claim 11, wherein said guide slots are transversely arranged into said guiding portion.

14. Apparatus as claimed in claim 11, wherein the width of said pivot guide pin is greater than the width of said guide slots and the width of said second guide pin is greater than the width of said first guide slot.

15. Apparatus as claimed in claim 11, wherein the transition from said guide path into said first guide slot is raised and curved and wherein said raised portion is partly extended within said guide path.

16. Apparatus as claimed in claim 11, wherein the length of said first guide pin is different from the length of said pivot guide pin and said second guide pin so that only said first guide pin can follow said raised portion into said first guide slot.

17. Computer, especially personal computer, having plug-in packages, especially PC cards, each plug-in package having at least a connector and plug-in guide means, said plug-in guide means having a pivot guide pin which is arranged on a significant distance from said connector and first and second guide pins, said computer comprising:

a circuit board mounted in said computer, said circuit board having a socket for connecting said connector of said plug-in package with said circuit board, wherein said connecting direction between said circuit board and said plug-in package is perpendicular to the insertion direction of said plug-in package;

a second guide means arranged on said computer for guiding said plug-in package by said plug-in package guide means into said computer, said second guide means comprises two cam plates which are separated by spacer means and supported by shaft means, each of said cam plates has a continuously recessed guide path for guiding said pins, said guide path has a guiding portion at a first level and a stop portion defining a moving pivot point for said plug-in package at a second level wherein the transition of said pivot pin from said guiding portion to said stop portion causes a defined rotation of said plug-in packages about said pivot point in the plane defined by said socket and said connector wherein said plug-in package is rotatably arranged at said pivot point; and guide slots are arranged in said guide path on said guiding portion, wherein said pivot guide pin is located in said stop portion and said guide pins are located within said guide slots in said guiding path when a connection between said connector and said socket is accomplished.

18. An apparatus comprising:

a housing with an opening for receiving components;

at least one guide mechanism for positioning an article within said housing mounted to the housing, said guide mechanism having at least a cam surface and a slot, indicating a home position, disposed relative to said cam surface; and a carrier plate having at least one pin mounted therein, and orientated to be transported along the cam surface until the pin enters the slot whereat the pin forms a pivot point as the carrier is moved through an arc relative to the pivot point and the pivot point moves horizontally relative to the cam surface as the carrier moves vertically, relative to said cam surface into a home position.

19. The apparatus of claim 18 including a circuit board mounted to said housing.

20. The apparatus of claim 19 further including an electrical connector mounted to the circuit board.

21. The apparatus of claim 20 further including a circuit card with an edge connector having electrical conductors therein which are inserted into said edge connector when the carrier is placed in the home position.

22. In an electrical machine having a housing a circuit board with electrical receptacle for mating with an edge connector of circuit card, a method for inserting said edge connector into the electrical receptacle without removing the housing, said method including the steps of:

providing in said housing a cam surface with a slot disposed relative to the cam surface and indicating a home position;

providing a carrier plate with a pin therein;

mounting the circuit card to said carrier plate;

inserting the carrier plate in an opening in said housing with the pin on the cam surface;

pushing the carrier plate in a first direction as the pin travels on the cam surface to fall into the slot; and moving the carrier in a second direction substantially perpendicular to the first direction to cause said pin to pivot in the slot and to displace from the pivot point to a another point as the edge connector is inserted in the receptacle.

* * * * *